(12) United States Patent
Page

(10) Patent No.: US 10,585,132 B2
(45) Date of Patent: Mar. 10, 2020

(54) WIRE TRACING SYSTEM AND METHOD

(71) Applicant: John Dennis Page, Greenville, SC (US)

(72) Inventor: John Dennis Page, Greenville, SC (US)

(73) Assignee: TWITCH TECHNOLOGIES LLC, Greenville, SC (US)

( * ) Notice: Subject to any disclaimer, the term of this patent is extended or adjusted under 35 U.S.C. 154(b) by 87 days.

(21) Appl. No.: 15/997,944

(22) Filed: Jun. 5, 2018

(65) Prior Publication Data

US 2018/0348281 A1 Dec. 6, 2018

Related U.S. Application Data

(60) Provisional application No. 62/515,209, filed on Jun. 5, 2017.

(51) Int. Cl.

| | | |
|---|---|---|
| *G01R 19/00* | (2006.01) |
| *G01R 31/02* | (2006.01) |
| *G01R 19/25* | (2006.01) |
| *G01R 29/18* | (2006.01) |
| *G01R 31/04* | (2006.01) |
| *G01R 25/00* | (2006.01) |
| G01R 1/067 | (2006.01) |
| H01R 13/66 | (2006.01) |
| H01R 13/641 | (2006.01) |
| H01R 12/59 | (2011.01) |

(52) U.S. Cl.
CPC ....... *G01R 31/023* (2013.01); *G01R 19/2506* (2013.01); *G01R 19/2516* (2013.01); *G01R 25/00* (2013.01); *G01R 29/18* (2013.01); *G01R 31/041* (2013.01); *G01R 1/06788* (2013.01); *G01R 31/021* (2013.01); *H01R 12/598* (2013.01); *H01R 13/641* (2013.01); *H01R 13/6616* (2013.01)

(58) Field of Classification Search
CPC .... G01R 31/023; G01R 29/18; G01R 31/021; G01R 31/041; G01R 25/00; H01R 13/641; H01R 13/6616; H01R 12/598
USPC .................................. 324/66, 67, 326–329
See application file for complete search history.

(56) References Cited

U.S. PATENT DOCUMENTS

| | | | | |
|---|---|---|---|---|
| 2003/0228005 A1* | 12/2003 | Melick | ................. | H04B 1/7172 379/93.01 |
| 2008/0159416 A1* | 7/2008 | Melick | ................. | H04B 1/7172 375/259 |
| 2012/0219259 A1* | 8/2012 | Kewitsch | ............ | G02B 6/3895 385/101 |

* cited by examiner

Primary Examiner — Raul J Rios Russo
(74) Attorney, Agent, or Firm — Nixon & Vanderhye P.C.

(57) ABSTRACT

A wire tracing system includes a voltage output source having a director circuit with a plurality of output channels. Each of the output channels outputs a unique voltage signature. A voltage reader/data recorder includes a conductive probe and a data memory that is partitioned into a plurality of data bins. Each of the data bins in the voltage reader/data recorder is associated with one of the voltage signatures output via the output channels of the director circuit, and each of the data bins is configured to store information associated with each of a plurality of wires to which the output channels are respectively connectable. The system and method permit a single individual to rapidly discover the identities of individual wires and cables without having to repeatedly travel back and forth between those extremities.

21 Claims, 3 Drawing Sheets

WIRE TRACING SYSTEM AND METHOD

CROSS-REFERENCES TO RELATED APPLICATIONS

This application claims the benefit of U.S. Provisional Patent Application No. 62/515,209, filed Jun. 5, 2017, the entire content of which is herein incorporated by reference.

STATEMENT REGARDING FEDERALLY SPONSORED RESEARCH OR DEVELOPMENT (NOT APPLICABLE)

BACKGROUND

This invention pertains generally to electrical and electronic circuitry components and, more specifically, to wire and cable tracing methodologies and devices.

Whether it is the installation of a simple home audio system, a large corporate server network, or the assembly of a sophisticated jet aircraft, wiring systems play a crucial role in insuring proper system functionality. It becomes apparent that if a system were available that could rapidly and accurately identify, as well as describe, the purpose of individual wires and cables at a bundle's far extremity, it would be of great value. While the term "wireless" has become trendy and garners substantial attention, the fact remains, when it comes to the delivery of energy and information, "hard-wired" systems hold several advantages over wireless systems, particularly in the areas of system reliability and security.

Wires and cables offer great value in that they enable components in multiple locations to function together as a single system. However, such systems will only function properly if all electrical connections at both extremities are perfectly correlated and connected accordingly. Any installer of audio-video systems, who has "pulled" a bundle of wires through conduit, has experienced the frustration of having their identification tags torn off, then suddenly having no idea as to which wire goes where.

In addition to physically labeling (tagging) cables, there are several other contemporary approaches to cable identification. A widely used method is the color-coding the individual cables, so that each color represents a specific/unique purpose. Color-coding is an excellent method of wire or cable identification, if there are relatively few wires or cables involved. However, when the number of distinct wires/cables exceeds a dozen or so, color-coding may become impractical.

A continuity checker such as an ohmmeter may also be employed to identify individual wires within a bundle. The continuity method involves the use of a known reference ground, which may take any of several forms including metal conduit or a specified cable within a bundle. This methodology enables a particular cable at one extremity, electrically connected to a reference ground, to be identified at the other extremity, simply by determining which wire or cable exhibits electrical continuity when connected to that known reference ground. However, there is a limitation to this methodology. Each wire/cable that is to be traced must first be individually connected to the reference ground at one extremity, and then by a process of elimination, every wire/cable at the other extremity must also be examined for continuity with the reference ground until that particular wire/cable is found. Once a particular cable or wire is identified, the whole process must be repeated until every wire or cable in the bundle is identified. It should be noted that the identification of a cable, in itself, does not provide details of the cable's purpose, or intended connection point.

If there are a large number of wires/cables involved, or if the extremities are widely separated, identification by checking wire continuity can be time-consuming, laborious, and frustrating, particularly if the task is attempted by a single individual. Two people, working together, with one person at each extremity, and having a reliable means of communication, can greatly increase the speed of the wire/cable identification process, when using the continuity methodology.

A popular wire tracing methodology utilizes a specialized toner that induces an audible tone into a wire or cable, which may then be detected by a probe sensitive to that sound if placed in the vicinity of that wire or cable. This system works well when tracing the route of a cable or group of cables but is of limited use when trying to discriminate individual wires or cables within a bundle. As with the continuity methodology, details of the cables' purposes, or their intended connection points are not provided.

BRIEF SUMMARY

The described embodiments pertain to a new class of wire and cable-tracing devices, which permit a user to easily identify individual wires or cables, even within a large bundle of wires or cables, and even when the extremities of those wires and cables are widely separated. Moreover, the described embodiments can facilitate the recording of detailed audio, text, or video information regarding the purpose and intended location for each of those wires or cables, and by means of a specialized probe device, recall and replay that same information for each wire or cable, at either extremity. The system may also exploit mobile computing devices to assist with input and output of information, as well as other functions.

The system enables the creation of rewritable, electronic identification/information tags. Each of these "V-tags" is correlated with a unique voltage of individual wires output by a voltage output source. These V-tags are stored in a series of digital memory bins contained within a voltage reader/data recorder. A wire is considered "tagged" when the voltage reader/data recorder establishes a direct correlation between a previously unassigned data bin, and a specific wire's unique voltage signature. The tagging is evidenced by the assignment of a bin-number, which is output by the voltage reader/data recorder.

Once a bin number has been assigned, that data bin will remain associated with that channel voltage, and whenever that voltage is sensed by the voltage reader/data recorder, that data bin will become active, and the number of that data bin will be output (e.g., displayed). When a data bin is active, depending upon the user's selection, information about that wire and channel may be recorded into the bin, or may recalled from the bin.

The system enables the correlation between a unique voltage signature and a specific wire, so that even when working with a large bundle of extremely long wires or cables, proper connections may be easily achieved.

An advantage of the described embodiments is that they permit a single individual to rapidly discover the specific identities of individual wires and cables, without having to repeatedly travel back and forth between those extremities. Additionally, the described embodiments permit the recording and playback of detailed audio, text and even video information for each individual wire or cable, at either extremity.

In an exemplary embodiment, a wire tracing system includes a voltage output source and a voltage reader/data recorder. The voltage output source includes a first power source, a director circuit coupled with the first power source that has a plurality of output channels, each of which outputs a unique voltage signature, and an output wire connected to each of the output channels. The voltage reader/data recorder includes a second power source, a conductive probe, and a data memory that is partitioned into a plurality of data bins. Each of the data bins in the voltage reader/data recorder is associated with one of the voltage signatures output via the output channels of the director circuit, and each of the data bins is configured to store information associated with a wire to which the output wires are connectable.

Each of the data bins may be operable between an inactive state and an active state, and when the conductive probe detects the voltage signature from one of the output channels of the director circuit, the data bin associated with the detected voltage signature may be turned from the inactive state to the active state. When the data bins are in the active state, the data bins may be configured to record or play back/recall the information associated with the wire to which the output wires are connectable. The voltage reader/data recorder may further include a user interface that may be configured to output the information associated with the wire to which the output wires are connectable. The user interface may be a display screen and/or a speaker.

In some embodiments, the voltage reader/data recorder may further include a processor communicating with the conductive probe, the data memory and the user interface.

In some embodiments, the voltage reader/data recorder may further include a recording circuit, where when the data bin associated with the detected voltage signature is in the active state, the recording circuit may be operable by a user to record the information associated with the wire to which the output wires are connectable.

The unique voltage signatures of the output channels may be separated by a set voltage differential, e.g., 100 mV. The conductive probe may include an adapter of a specific shape or an extension.

The voltage reader/data recorder may also include a transmitter that is configured to transmit the voltage signature detected by the conductive probe to a remote processor.

In another exemplary embodiment, a wire tracing system includes a voltage output source including a director circuit with a plurality of output channels, each of which outputs a unique voltage signature, and a voltage reader/data recorder including a conductive probe and a data memory that is partitioned into a plurality of data bins. Each of the data bins in the voltage reader/data recorder is associated with one of the voltage signatures output via the output channels of the director circuit. Each of the data bins is configured to store information associated with each of a plurality of wires to which the output channels are respectively connectable.

In yet another exemplary embodiment, a method of tracing individual wires in a bundle of wires using a wire tracing system includes the steps of (a) connecting the voltage output source and the voltage reader/data recorder to a common reference ground; (b) connecting each of the wires in the bundle of wires to one of the plurality of output channels; (c) contacting the conductive probe with one of the wires in the bundle of wires and detecting the voltage signature in the one of the wires; (d) activating the data bin associated with the detected voltage signature; and (e) the voltage reader/data recorder outputting information associated with the one of the wires stored in the activated data bin. The method may also include, after step (d) and prior to step (e), recording the information associated with the one of the wires in the activated data bin. The method may further include repeating steps (c), (d) and (e) for each of the wires in the bundle of wires.

BRIEF DESCRIPTION OF THE DRAWINGS

These and other aspects and advantages will be described in detail with reference to the accompanying drawings, in which.

DETAILED DESCRIPTION

This present invention makes possible the recording and playback of detailed information regarding individual wires or cables within a bundle of wires or cables. This information may be recalled at either termination. For the purpose of this description, the terms "wire" and "cable" may be used interchangeably. When the term "bundle" is used, it indicates a group of wires running together to the same destination, that, for the sake of efficiency are bound or bundled together as a single entity. When mention is made of the probe or tip of the voltage reader/data recorder being placed into contact with a wire or cable, it may be assumed that the description is referring to the conductive portion of each.

Figure 1:
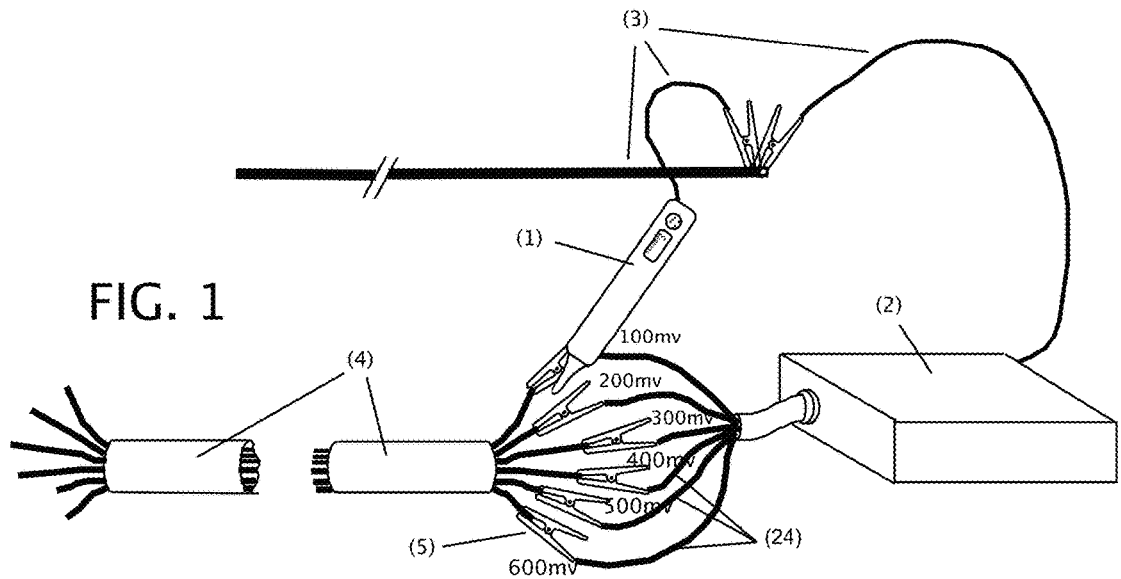
FIG. 1 shows the wire tracing system with the voltage reader/data recorder at a near end of a wire bundle.
Figure 2:
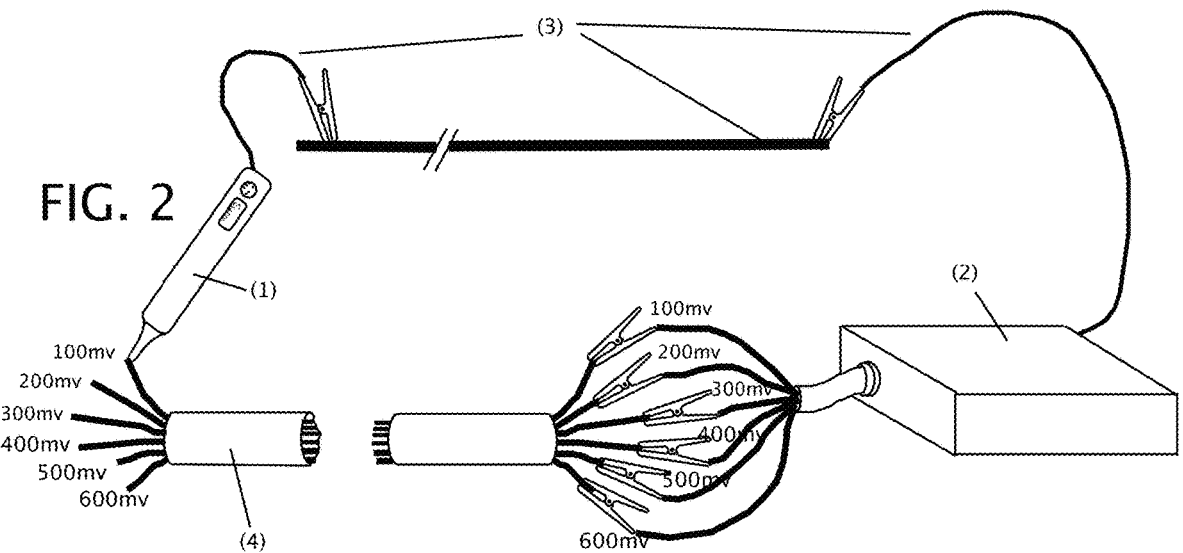
FIG. 2 shows the wire tracing system with the voltage reader/data recorder at a far end of the wire bundle.

With reference to FIG. 1, the system of the described embodiments includes two main components, a voltage output source or director circuit 2 and a voltage reader/data recorder 1, each of which is connected to a common reference ground 3. The reference ground 3 may take the form of one of the wires in a bundle 4, a conductive conduit, or anything that provides electrical continuity to the vicinity of the wire and cable's extremities.

Figure 6:
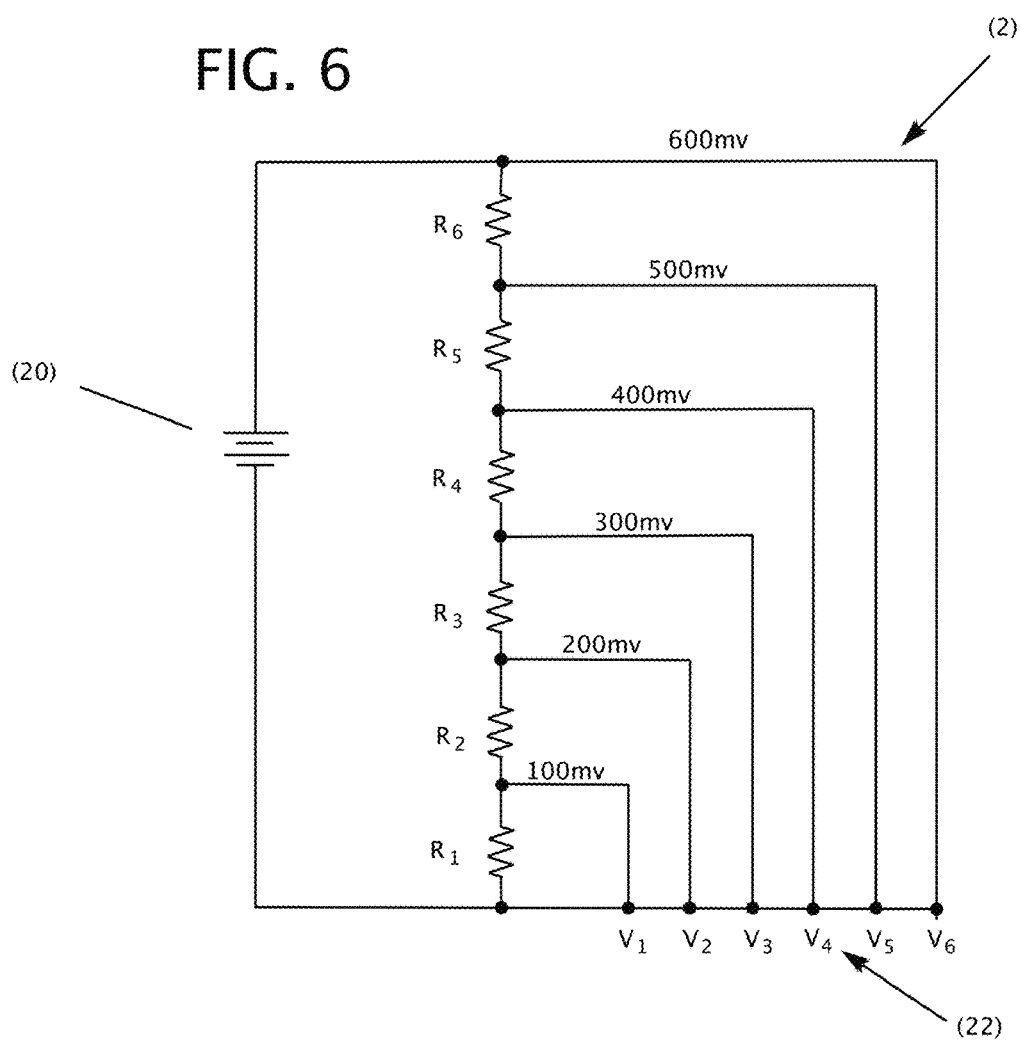
FIG. 6 is an exemplary circuit diagram of the director circuit.

In some embodiments, with reference to FIG. 6, the voltage output source 2 is a director circuit with a power supply 20 and a plurality of resistors R1-R6. The resistors R1-R6 provide for continuous, unique voltage signatures V1-V6 through a plurality of output channels 22. Although the director circuit 2 shown in FIG. 6 includes six (6) resistors and six (6) corresponding output channels, it will be appreciated that there could be more or fewer of either, and the invention is not meant to be limited to the exemplary embodiment shown in the drawings.

There are minimum voltage differentials between any two output channels (e.g., 100 millivolts). Each of these output channels 22 is preferably connected to small-gauge insulated cables 24, each terminating in an alligator clip 5 or other means for connecting to individual wires or cables within a cable bundle.

The voltage reader/data recorder 1 is a compact, handheld device. In some embodiments, with reference to FIG. 4, the voltage reader/data recorder 1 incorporates a conductive probe 11, a power supply 26, a voltmeter 28, a microprocessor 30, a user interface 13 such as a display screen or the like, one or more multi-function switches 32, a digital record/playback system 34 and a memory 36 that is divided into a plurality of data bins.

A function of the voltage reader/data recorder 1 is to record and store digital information regarding specific wires (tagging) and, when prompted, recall and replay that information (reading the tags). This information is stored as digital data in the data bins of the voltage reader/data recorder 1 on-board memory 36, each of which is responsive to one of the unique channel voltages emanating from the director circuit. These unique channel voltages are also each correlated with specific data bins within the voltage reader/data recorder 1, so that when it detects a specific voltage associated with a particular data bin, that data bin becomes active.

When a bin is in an active state, depending upon the mode selected by the user, information about the corresponding wire or cable may be recorded into the bin, or it may be retrieved and played back. The digital data may take any of several forms including audio, video, or text. Each unique voltage supplied by the voltage output source 2 various channels correlates to a specific "data bin" within the voltage reader/data recorder 1. There are minimum voltage differentials between any two output channels (e.g., 100 millivolts). These voltages, when introduced at one extremity of a cable, will be readable by the voltage reader/data recorder 1 at the other extremity. Because the voltage output source 2 and the voltage reader/data recorder 1 share a common reference ground 3, placing the voltage reader/data recorder's conductive tip 11 in contact with any of the voltage output source output channel wires 24, allows a circuit to be completed so that each channel's unique output voltage may be read by the voltage reader/data recorder 1. The detected voltages correspond to, and will permit access to, data bins containing information on those particular cables and wires.

The voltage reader/data recorder 1 may incorporate a digital display 13 or other user interface (e.g., speaker or the like), which displays the number of the currently active data bin, only one of which may be active at a time. While a specific channel-bin is in the active state, a "record" button 32 on the voltage reader/data recorder 1 may be pressed, and by means of a built-in microphone 14, a user will be able record a custom message detailing the identity and usage of that particular channel and associated cable, and have that information placed into the corresponding data bin. The process may be repeated until each channel/cable has been assigned a data bin and a unique message has been created for each of those bins. It should be understood that any of several formats for recording and recalling information, including audio, text and video may be used.

After recording messages into data bins corresponding to the various channel outputs, the voltage reader/data recorder 1 may be taken to the other (far end) extremity of the cable bundle. As long as the ground wire of the voltage reader/data recorder 1 is connected to the common ground 3 shared with the voltage output source 2, the tip of the voltage reader/data recorder 1 may be placed into contact with any of the various wires or cables, and the voltages for each of those wires may be read, allowing access to the corresponding data bins in the voltage reader/data recorder 1.

The voltage output source 2 offers several unique output channel voltages, each of which is connected to a specific cable or wire, within a bundle 4 of cables. Each wire associated with a specific voltage, in turn correlates with a specific data bin within the voltage reader/data recorder 1. When the voltage reader/data recorder's probe 11 touches a cable and "reads" its voltage, the voltage reader/data recorder 1 will communicate the associated bin number by a display or speaker or the like. The user, at that time, may choose, to press a button, or take another action, causing that bin to become active. The "active status" of that bin will be indicated on the display. When a bin is in an active state, the user has the option of recording details about the corresponding cable, including its purpose and destination into that bin. If the bin already contains information, that fact will be indicated on the display. The user may choose to review that information, or after receiving an alert from the voltage reader/data recorder 1, they may choose to record over that information.

Recorded information may be in any of several formats, including, but not limited to, audio, video, or text. Information contained in data bins may be discoverable at either extremity of the cables.

Figure 4:
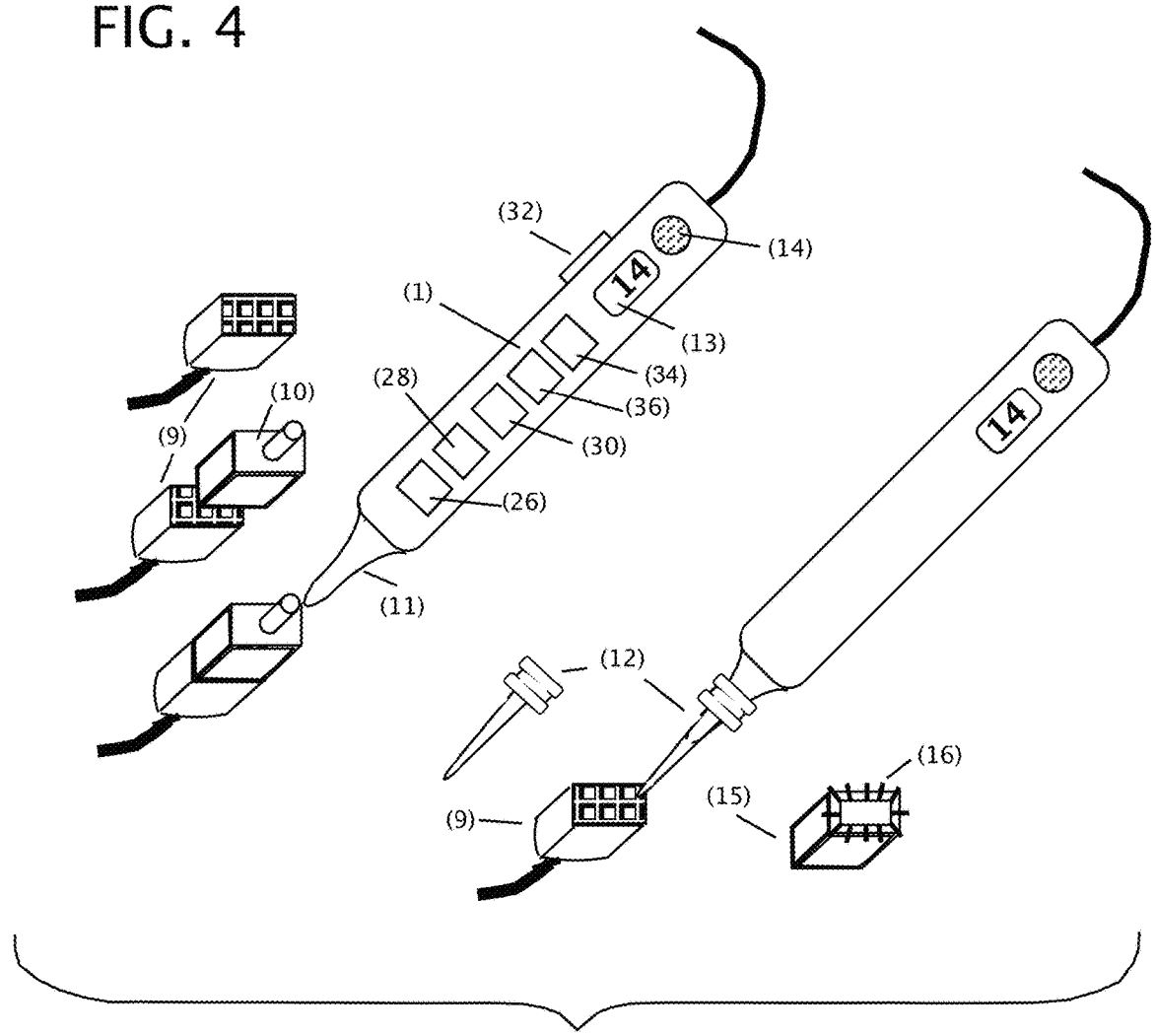
FIG. 4 shows exemplary adapters and extensions for facilitating a connection by the voltage reader/data recorder.

With continued reference to FIG. 4, cables to be traced may terminate in special connectors 9, such as those made by Molex®, which would normally restrain or preclude easy access to voltage reader/data recorder's probe 11. The probe 11 in this embodiment may employ specially fitted adapters 10 that would mate with these connectors and provide easily accessible contact points for the probe 11. Similarly, adapters or extensions 12 may be placed onto the probe 11 to facilitate functionality. In certain situations, such as when working with electronic circuitry, connecting cables may be composed of a number of very small gauge wires. In such cases, the small cable and its connector 9 may be treated as a bundle. In order to facilitate access to the various channel voltages, an accessory 15 may be mated with the connector 9. This accessory provides easily accessible touch points or wire breakout points 16 that correspond with connector 9 output voltages.

Figure 5:
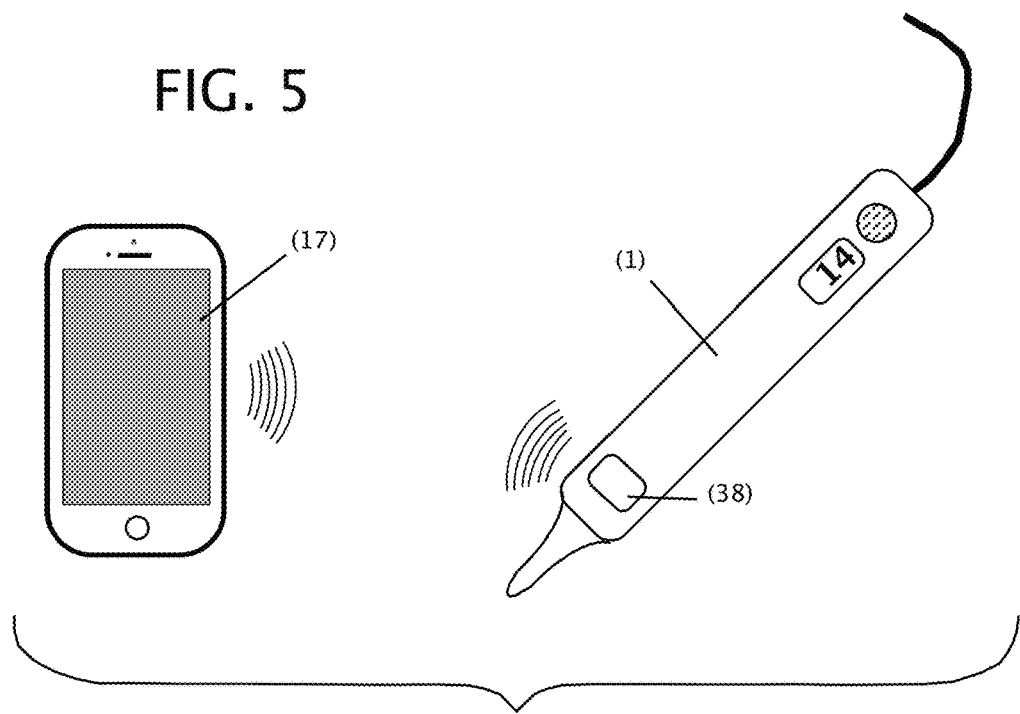
FIG. 5 shows an exemplary application with a wireless transmission function.

The system may also incorporate outboard communication equipment. Such equipment may be electrically connected to the voltage reader/data recorder 1, or it may employ a wireless interface. For instance, with reference to FIG. 5, the voltage reader/data recorder may include a Bluetooth adapter 38 that would allow mobile computers 17 such as smartphones to become an integral part of the voltage reader/data recorder system, facilitating the creation and playback of text, audio or video messages associated with their data bins and their respective wires and cables. Potentially, data created by and for the voltage reader/data recorder 1 could reside on the mobile computer 17. Moreover, with the assistance of a few accessories, the system could take the form of a mobile app.

The voltage reader/data recorder 1 may incorporate an onboard digital display 13, capable of displaying text messages. It may further display the currently selected "bin" number, as well as a variety of modes, such as whether or not that bin is in an active state, and if so, whether it is in a playback or record mode. There may also be additional audio/visual warning cues, such as to prevent the inadvertent overwriting of important data.

When a bin number is first assigned to an empty data bin, the bin may default to an active record state, immediately permitting the recording of data concerning that specific wire.

Once the wires and channel voltages have been assigned to their data bins, the voltage reader/data recorder may be removed from contact with the wiring system (moved out of circuit) and still permit the editing of the content of the data bins. Even while out of circuit, by pressing a master button 32 on the voltage reader/data recorder 1, or by some other means, the user may be able cycle through the various data bin numbers. While a particular bin number is displayed, an action, such as a button being pressed, may cause the corresponding bin to become active. When a bin is in an active state, depending upon the selection, data may be placed into the bin (recorded), edited (recorded over) or it may be retrieved (played back) from that bin. Only one channel's bin may be active/open at a time.

Having the voltage reader/data recorder out of circuit and untethered provides greater flexibility of data entry, and editing. As an example, a voltage reader/data recorder featuring microphone element could act as a portable hand-held microphone that could be placed close to the user's mouth, increasing the quality of the recording. The voltage reader/data recorder 1 could also feature a built in speaker or headphone jack, to facilitate efficient review of recorded data. An untethered voltage reader/data recorder would facilitate off-site editing of data bin information.

For playback, when the voltage reader/data recorder probe 11 is placed in contact with one of the voltage output source's voltage-bearing output cables 24, a circuit is completed, enabling the output voltage of that particular channel and associated cable to be determined. Each voltage bearing cable correlates with specific data bin, so that when the voltage reader/data recorder 1 detects a voltage, the data bin associated that voltage is made accessible. This output voltage and cable identities and purposes may be discoverable at either extremity of the cable being examined.

Each digital data bin on the voltage reader/data recorder 1 corresponds to a unique channel voltage supplied by the voltage output source, and is capable of storing a substantial volume of digital information. When the voltage reader/data recorder 1 is in the appropriate mode, it can read the channel voltages from the voltage output source 2. Upon reading a channel voltage, the voltage reader/data recorder bin corresponding to that voltage particular bin becomes "active". Once a bin has become active, a specified command may be issued that will permit the recording of data into that bin. In a like manner, a different specified command may be issued that will permit that information to be recalled from that bin.

Depending upon the requirement, once a bin has become active, the voltage reader/data recorder 1 may be capable of recording or playing back audio, text, or video messages detailing the identity and purposes of individual wires. The system may also incorporate Bluetooth or other wireless technologies 38 to interface with external devices 17 including smart phones, and headphones. When working with mobile computers, in addition to handling the recording, and playback tasks, the mobile computer may be used to host the data bins, as well as perform the majority computer processing tasks. In such instances, the voltage reader/data recorder's main functions could be relegated to voltage sensing and reporting that data to the computer.

Figure 3:
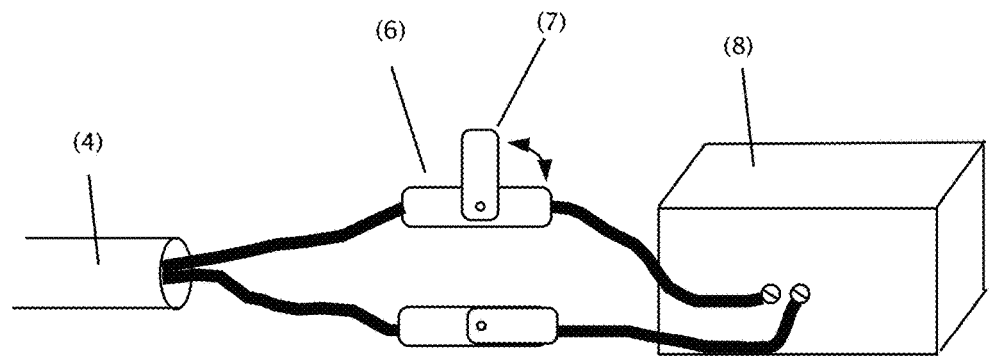
FIG. 3 shows an exemplary application using an isolation switch for pre-connected wires.

If the wires 4 being examined are electrically connected to equipment or to other wires and cables, the voltage readings may be adversely affected, preventing precise measurements of the voltage output source's voltage outputs. With reference to FIG. 3, this problem may be overcome by use of a specially designed in-line switch 6, which allows each wire to become electrically isolated even while that wire is connected to equipment 8. These specialized switches 6, when open, may expose a contact point 7 that may receive connections from the director circuit 2, or the voltage reader/data recorder 1.

The following is a synopsis of how the system might be utilized:

1. The voltage output source and voltage reader/data recorder are each connected to a common ground that runs the full length of the wires to be identified. This ground may be one of the wires in a bundle, or it may be some other conductive material including the wires' own conduit. This common ground completes a circuit between the voltage output source and the voltage reader/data recorder so that channel-voltages from the voltage output source may be measured by the voltage reader/data recorder.

2. Each of the voltage output source's wires carry a unique voltage and are connected at random to the wires to be traced.

3. Each of the voltage output source's voltage channels corresponds to a unique bin number in the voltage reader/data recorder. When the conductive probe of the voltage reader/data recorder (or a probe extension clip) is placed in contact with one of the bundle's wires, a channel voltage from the voltage output source is sensed and activates the corresponding bin, at which time the number of that bin is communicated to the user such as by being shown on the voltage reader/data recorder's display.

4. If a bin number has not yet been assigned to that channel voltage, the number "zero" will be indicated on the voltage reader/data recorder's display. Pressing a button on the voltage reader/data recorder will cause an unused bin number to be assigned to that voltage.

5. Anytime a voltage is sensed, regardless of which extremity, the corresponding bin may become active, and its assigned bin number will be displayed. When a bin is active, the user may choose to go into a record or playback mode.

6. To discover the identities of the wires at the far extremity, the voltage reader/data recorder may be placed in contact with the wire or connector in question. The voltage sensed by the voltage reader/data recorder will cause the corresponding bin to become active, and the display can display the appropriate bin number. At that time, the user can instruct the voltage reader/data recorder to playback the contents of that data bin. The playback may take the form of an audible message played through an integrated speaker, an alphanumeric message, or a video, which may be displayed on the voltage reader/data recorder's display system, or an external device.

7. The system may work in conjunction with a mobile computer, possibly by a wireless link such as Bluetooth.

8. The voltage reader/data recorder may be tied to a label generator/printer, allowing the quick production of labels/tags for later visual identification.

9. Other accessories may include but are not limited to headphones, specialized jumper wires, isolation switches and various connection adapters, etc.

10. It is possible that the system could respond to external signals, including voice commands.

The system is a wire tracing system composed of two main components, a voltage output source and a voltage reader/data recorder. The voltage output source outputs a variety of unique channel voltages, each of which is connected to individual, unique wires within a bundle of wires.

The voltage reader/data recorder is a hand-held device, preferably microprocessor-based, which features a number of digital data storage bins, each correlated with one of the voltage output source's channel voltages. The voltage reader/data recorder integrates a conductive probe, which when placed in contact with a wire, will read that wire's voltage output, again correlated with a particular data bin. This voltage may be sensed at either of the wire's extremities.

Anytime the voltage reader/data recorder senses a voltage corresponding to a specific data bin, that data bin may become active. While a data bin is in an active mode, the user is given the option of recording information about the corresponding wire, its purposes, and connections, or they may choose to playback that data bin's information. Digital information in the data bins may be recorded or played back in any of several formats, including text, audio or video.

Channel tagging occurs when unique data bins are mated with unique voltage channels. Each voltage channel that is correlated with a data bin receives a unique v-tag. Writing a tag is the recording of information regarding the corresponding wire and voltage channel. The recording may take any of several forms including text, audio, and video. Reading the tag, then, is the playback of the information contained in the data bin, regardless of the format.

While the invention has been described in connection with what is presently considered to be the most practical and preferred embodiments, it is to be understood that the invention is not to be limited to the disclosed embodiments, but on the contrary, is intended to cover various modifications and equivalent arrangements included within the spirit and scope of the appended claims.

The invention claimed is:

1. A wire tracing system comprising:
   a voltage output source including:
      a first power source,
      a director circuit coupled with the first power source, the director circuit including a plurality of output channels, each of which outputs a unique voltage signature, and
      an output wire connected to each of the output channels; and
   a voltage reader/data recorder including:
      a second power source,
      a conductive probe, and
      a data memory that is partitioned into a plurality of data bins,
   wherein each of the data bins in the voltage reader/data recorder is associated with one of the voltage signatures output via the output channels of the director circuit, and wherein each of the data bins is configured to store information associated with a wire to which the output wires are connectable.

2. A wire tracing system according to claim 1, wherein each of the data bins is operable between an inactive state and an active state, and wherein when the conductive probe detects the voltage signature from one of the output channels of the director circuit, the data bin associated with the detected voltage signature is turned from the inactive state to the active state.

3. A wire tracing system according to claim 2, wherein when the data bins are in the active state, the data bins are configured to record or recall the information associated with the wire to which the output wires are connectable.

4. A wire tracing system according to claim 3, wherein the voltage reader/data recorder further comprises a user interface that is configured to output the information associated with the wire to which the output wires are connectable.

5. A wire tracing system according to claim 4, wherein the user interface comprises a display screen.

6. A wire tracing system according to claim 4, wherein the user interface comprises a speaker.

7. A wire tracing system according to claim 4, wherein the voltage reader/data recorder further comprises a processor communicating with the conductive probe, the data memory and the user interface.

8. A wire tracing system according to claim 2, wherein the voltage reader/data recorder further comprises a recording circuit, and wherein when the data bin associated with the detected voltage signature is in the active state, the recording circuit is operable by a user to record the information associated with the wire to which the output wires are connectable.

9. A wire tracing system according to claim 1, wherein the unique voltage signatures of the output channels are separated by a set voltage differential.

10. A wire tracing system according to claim 9, wherein the set voltage differential is 100 mV.

11. A wire tracing system according to claim 1, wherein the conductive probe comprises an adapter of a specific shape or an extension.

12. A wire tracing system according to claim 1, wherein the voltage reader/data recorder further comprises a transmitter that is configured to transmit the voltage signature detected by the conductive probe to a remote processor.

13. A wire tracing system comprising:
   a voltage output source including a director circuit with a plurality of output channels, each of which outputs a unique voltage signature; and
   a voltage reader/data recorder including a conductive probe and a data memory that is partitioned into a plurality of data bins,
   wherein each of the data bins in the voltage reader/data recorder is associated with one of the voltage signatures output via the output channels of the director circuit, and wherein each of the data bins is configured to store information associated with each of a plurality of wires to which the output channels are respectively connectable.

14. A wire tracing system according to claim 13, further comprising output wires one each respectively connected to each of the output channels, the output wires being connectable to individual wires of the plurality of wires.

15. A wire tracing system according to claim 13, wherein each of the data bins is operable between an inactive state and an active state, and wherein when the conductive probe detects the voltage signature from one of the output channels of the director circuit, the data bin associated with the detected voltage signature is turned from the inactive state to the active state.

16. A wire tracing system according to claim 15, wherein when the data bins are in the active state, the data bins are configured to record or send the information associated with a corresponding one of the plurality of wires.

17. A wire tracing system according to claim 15, wherein the voltage reader/data recorder further comprises a recording circuit, and wherein when the data bin associated with the detected voltage signature is in the active state, the recording circuit is operable by a user to record the information associated with a corresponding one of the plurality of wires.

18. A wire tracing system according to claim 13, wherein the voltage reader/data recorder further comprises a user interface that is configured to output the information associated with a corresponding one of the plurality of wires.

19. A method of tracing individual wires in a bundle of wires using a wire tracing system including a voltage output source with a director circuit having a plurality of output channels, each of which outputs a unique voltage signature, and a voltage reader/data recorder including a conductive probe and a data memory that is partitioned into a plurality of data bins, wherein each of the data bins in the voltage reader/data recorder is associated with one of the voltage signatures output via the output channels of the director circuit, the method comprising:

(a) connecting the voltage output source and the voltage reader/data recorder to a common reference ground;
(b) connecting each of the wires in the bundle of wires to one of the plurality of output channels;
(c) contacting the conductive probe with one of the wires in the bundle of wires and detecting the voltage signature in the one of the wires;
(d) activating the data bin associated with the detected voltage signature; and
(e) the voltage reader/data recorder outputting information associated with the one of the wires stored in the activated data bin.

20. A method according to claim 19, further comprising, after step (d) and prior to step (e), recording the information associated with the one of the wires in the activated data bin.

21. A method according to claim 19, further comprising repeating steps (c), (d) and (e) for each of the wires in the bundle of wires.

* * * * *